(12) United States Patent
Grove (10) Patent No.: US 7,319,310 B2
(45) Date of Patent: Jan. 15, 2008

(54) REGULATED POWER SUPPLY UNIT

(75) Inventor: Andrew B. Grove, St. Neots (GB)

(73) Assignee: Audio Note UK Ltd. (GB)

( * ) Notice: Subject to any disclaimer, the term of this patent is extended or adjusted under 35 U.S.C. 154(b) by 0 days.

(21) Appl. No.: 11/680,502

(22) Filed: Feb. 28, 2007

(65) Prior Publication Data
US 2007/0152755 A1 Jul. 5, 2007

Related U.S. Application Data

(62) Division of application No. 10/339,269, filed on Jan. 9, 2003, now Pat. No. 7,202,645.

(51) Int. Cl.
*G05F 1/40* (2006.01)
*G05F 1/607* (2006.01)

(52) U.S. Cl. .................. 323/265; 323/227; 323/291

(58) Field of Classification Search ............... 330/277, 330/279, 303, 304, 305; 327/306–318, 538–540; 323/227, 265, 291
See application file for complete search history.

(56) References Cited

U.S. PATENT DOCUMENTS

| | | | |
|---|---|---|---|
| 3,924,154 A | 12/1975 | Minks | 315/78 |
| 4,124,886 A | 11/1978 | Black et al. | 327/306 |
| 4,547,881 A * | 10/1985 | Varadarajan | 327/539 |
| 4,551,670 A | 11/1985 | Anders et al. | 323/281 |
| 5,319,536 A | 6/1994 | Malik | 363/65 |
| 5,341,090 A | 8/1994 | Hoover | 324/123 |
| 5,374,898 A | 12/1994 | Harvey | 330/254 |

(Continued)

OTHER PUBLICATIONS

"A Low-Voltage Low-Power Fully-Integratable Front-End for Hearing Instruments" by Serdijn et al., IEEE Transactions on Circuits and Systems—I: Fundamental Theory and Applications, vol. 42, No. 11, Nov. 1995.

(Continued)

*Primary Examiner*—Jessica Han
(74) *Attorney, Agent, or Firm*—Gordon & Jacobson, P.C.

(57) ABSTRACT

An improved power supply unit includes a DC power source having a positive terminal and a negative terminal, and a voltage regulating circuit that includes a plurality of elements coupled in series between the positive and negative terminals of the DC power source to regulate the power supply signals supplied thereto to effectively cancel ripple and noise in such power supply signals. In one embodiment, the series-coupled elements include at least one resistor and a transconductive element having a characteristic transconductance value of T. The at least one resistor provides a resistance substantially equal to 1/T. The transconductive element and the one resistor cooperate to suppress spurious voltage level variations produced by the DC power source. The transconductive element may be realized by a thermionic triode, field effect transistor or other suitable device. In an alternate embodiment, the series-coupled elements include at least one active device and a transconductive element which cooperate to suppress spurious voltage level variations produced by the DC power source.

20 Claims, 7 Drawing Sheets

U.S. PATENT DOCUMENTS

| | | | |
|---|---|---|---|
| 5,410,274 A | 4/1995 | Birdsall et al. | 330/265 |
| 5,548,204 A | 8/1996 | Armstrong, II et al. | 323/265 |
| 5,691,663 A | 11/1997 | Nayebi et al. | 327/560 |
| 5,774,020 A | 6/1998 | Kimura | 330/252 |
| 5,838,191 A | 11/1998 | Opris et al. | 327/539 |
| 5,880,641 A | 3/1999 | Kim | 330/303 |
| 5,926,060 A | 7/1999 | Olgaard et al. | 327/538 |
| 5,949,085 A | 9/1999 | Barrett | 250/551 |
| 5,952,860 A | 9/1999 | Van Sanders et al. | 327/219 |
| 6,175,525 B1 | 1/2001 | Fulkerson et al. | 365/189.05 |
| 7,071,784 B2 | 7/2006 | Seremeta | 330/311 |

OTHER PUBLICATIONS

"The Bride of Zen: A Single Gain Stage Preamplifier" by Nelson Pass, The Audio Amateur, Apr. 1994.

"The PowerLight $9.0^{PFC}$—High-Power Innovations in Audio Amplifier Technology" 1998 QSC Audio Products, Inc., no month.

"Switching regulators demystified", by Tom Mathews, downloaded from Www.web-ee.com/files/w, 2003, no month.

\* cited by examiner

REGULATED POWER SUPPLY UNIT

This application is a divisional of U.S. application Ser. No. 10/339,269, filed on Jan. 9, 2003 now U.S. Pat. No. 7,202,645, which is hereby incorporated herein by reference in its entirety.

BACKGROUND OF THE INVENTION

1. Field of the Invention

This invention relates broadly to the regulation of power supplied to an electrical circuit. More particularly, this invention relates to the regulation of power supplied to sensitive equipment such as high fidelity audio components.

2. State of the Art

A power supply that provides a well-regulated noise-free and ripple-free voltage level is an essential part of sensitive equipment, such as high fidelity audio components (e.g., audio preamplifiers, digital-to-analog converters, amplifiers, etc). Typically, such equipment employs a switched power supply device and a complex feedback and control scheme to minimize variations in the voltage level produced by the power supply. However, such complex feedback and control schemes are difficult and expensive to design and manufacture. Furthermore, such feedback power supply schemes can be detrimental to the sound quality of audio components in which they are used.

Thus, there is a great need for an improved power supply mechanism that efficiently provides a well-regulated supply of power suitable for use in sensitive equipment, such as high fidelity audio components (e.g., audio preamplifiers, digital-to-analog converters, amplifiers, etc).

SUMMARY OF THE INVENTION

It is therefore an object of the invention to provide a mechanism that provides a well-regulated noise-free supply of power that is suitable for sensitive equipment, such as high fidelity audio components.

It is another object of the invention to provide a well-regulated supply of power that is easy and inexpensive to design and manufacture.

It is a further object of the invention to provide circuitry that minimizes variations in the voltage level produced by a DC power source.

It is an additional object of the invention to provide a power supply unit that minimizes variations in the voltage level produced by the power supply unit.

It is still another object of the invention to provide an audio component that includes a power supply unit that minimizes variations in the voltage level produced by the power supply unit.

In accord with these objects, which will be discussed in detail below, a power supply unit includes a DC power source and a voltage regulating circuit. The voltage regulating circuit includes a plurality of elements coupled in series between the positive and negative terminals of the DC power source which cooperate to suppress spurious voltage level variations produced by the DC power source.

According to one embodiment of the present invention, the series of elements include at least one resistor ($R_1$) and a transconductive element having a characteristic transconductance value of T. The resistor ($R_1$) provides a resistance substantially equal to 1/T. The transconductive element and the resistor ($R_1$) cooperate to suppress spurious voltage level variations produced by the DC power source. A voltage reference, which is preferably coupled between the input node of the one resistor ($R_1$) and a control terminal of the transconductive element, sets the DC output voltage and DC output current supplied to an active load. In addition, the output impedance of the voltage regulating circuit is preferably made small (and approximates the resistance (1/T) of the resistor ($R_1$)) with the addition of at least one other resistor ($R_2$) in the series-coupled chain of elements.

The transconductive element may be realized by a three-terminal thermionic triode, a three-terminal field effect transistor, a bipolar transistor, or other suitable device.

In another embodiment of the present invention, the series-coupled chain of elements include at least one active device and a transconductive element. The at least one active device is operably coupled between a first node and an output node. The transconductive element has an input terminal operably coupled to the first node. The output node is operably coupled to the active load. The transconductive element operates in response to small signal voltage variations at the first node to provide a first small-signal voltage drop across the transconductive element. The at least one active device provides a second small-signal voltage drop between the first node and the output node that is substantially equal to the first small-signal voltage drop to thereby reduce variations in power supply signals provided by the DC power source and supplied to the active load via the output node.

The transconductive element and the at least one active device may comprise vacuum tube devices (such as a matching triode valve device and diode valve device) or transistor devices (such as matching bipolar transistors) with substantially similar operating characteristics.

In accordance with the present invention, the improved power supply unit is part of an audio component and is adapted to provide a supply of well-regulated power to the audio signal processing circuitry realized therein.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
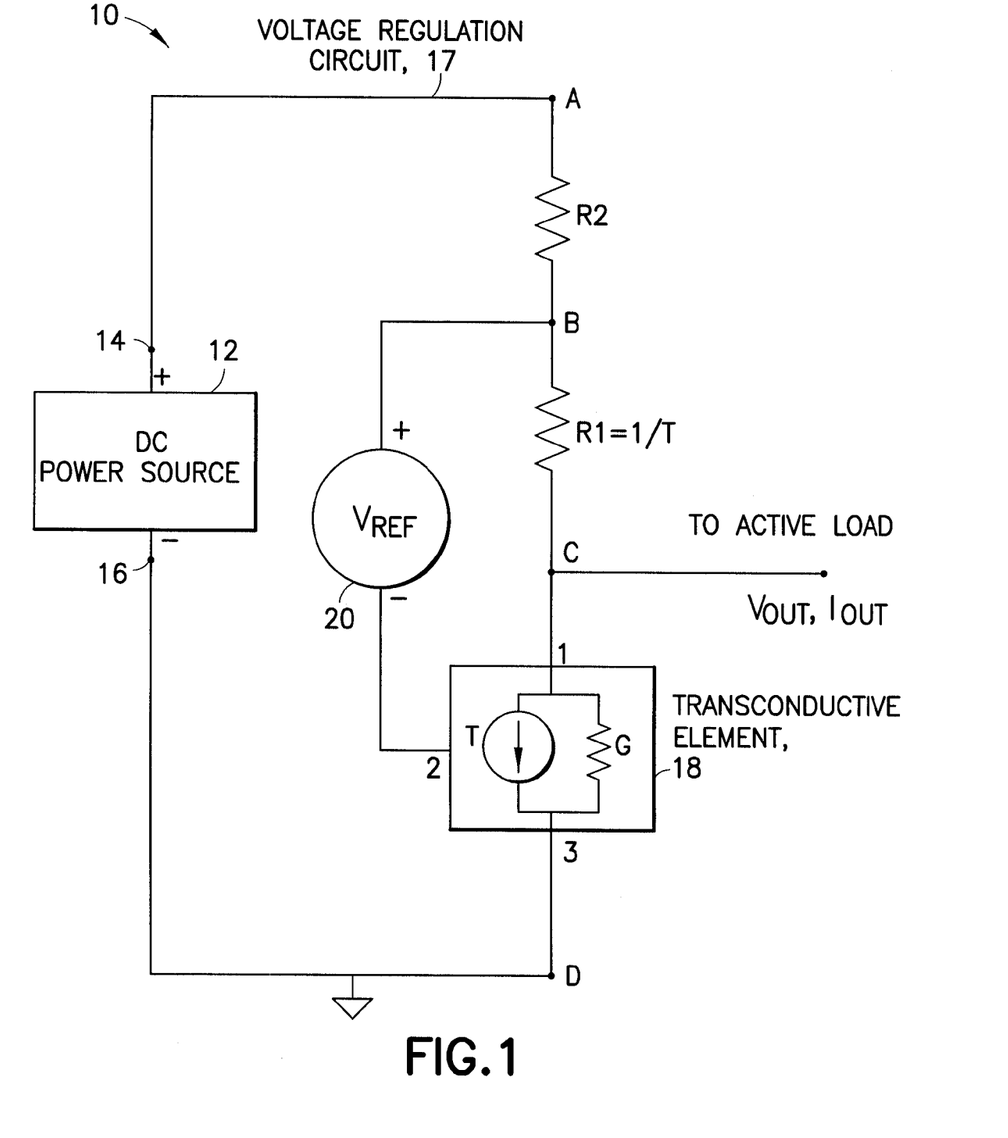
FIG. 1 is a schematic diagram of a generalized embodiment of an improved power supply unit in accordance with the present invention.

Turning now to FIG. 1, there is shown a generalized embodiment of the improved power supply unit 10 in accordance with the present invention, including a DC power source 12 having a positive input terminal 14 and a negative input terminal 16. The DC power source 12 may be an AC-to-DC power converter (which may be realized, for example, by a mains transformer and associated components) that converts an AC power signal from an AC power source (not shown) into the requisite DC voltage signal. Alternatively, the DC power source 12 may be battery or other suitable form of DC power supply. The DC power source 12 has its own complex internal impedance and noise associated with it. Part of the operation of the power supply unit 10 is to nullify the effects of these.

A voltage regulation circuit 17 includes a number of circuit elements coupled in series between the positive and negative terminals 14,16 of the DC power source 12. These circuit elements include a resistor R2, resistor R1, and a transconductive element 18. The transconductive element 18 is a voltage-controlled current source that produces a current flowing therethrough (between terminals 1 and 3 as shown) in an amount proportional to a control voltage level supplied thereto (which is supplied to control terminal 2 as shown). The ratio of such current to the control voltage level is defined by a characteristic transconductance value T. Associated with any non-ideal transconductive device is a parallel resistance G as shown. The transconductive element 18 may be a three terminal device, such as a thermionic triode 18a shown in the embodiment of FIG. 2, a transistor 18b shown in the embodiment of FIG. 3, or any similar device.

As shown in FIG. 1, node A is the junction of the positive terminal 14 of the DC power source 12 and the resistor R2, node B is the junction of resistor R2 and resistor R1, node C is the junction of resistor R2 and the input of the transconductive element 18, and node D is the junction of the output of element 18 and the negative terminal 16 of the DC power source 12. Node D is the ground (or reference) for the power supply unit 10, and node C provides a stabilized voltage level to the active circuit load coupled thereto.

The voltage regulation circuit includes a voltage reference 20, preferably coupled between node B and the control terminal (e.g., terminal 2) of the transconductive element 18 as shown, that supplies a bias voltage level to the control terminal of the transconductive element 18. This bias voltage level along with the resistance value of resistor R2 sets the DC operating characteristics of the transconductive element 18 and the steady state output voltage level and current level supplied to the active load from node C. Moreover, node B is electrically coupled to the control terminal (e.g., terminal 2) of the transconductive element 18 such that small signal variations in the voltage level at node B are supplied to the control terminal. The voltage reference 20 may be realized by a zener diode, a gas glow discharge tube or similar stable reference device.

For proper stabilization of the voltage level produced at the output node C, the resistance value of resistor R1 is substantially equal to 1/T. In this configuration, spurious fluctuations and noise at the input node A are nulled out by compensation provided by the resistor R1 and the transconductive element 18. Such compensation is apparent from the following analysis of the circuitry.

One can assume that the current between node B and the control terminal (e.g., terminal 2) of the transconductive element 18 is negligible. In accordance with Kirchhoff's Current Law at node B, the current flowing from node A to node B is equal to the current flowing node B to node C, which provides:

$$\frac{V_a - V_b}{R_2} = \frac{V_b - V_c}{R_1} \qquad (1)$$

Equation (1) can be rewritten as:

$$V_b = V_c + \left((V_a - V_c)\frac{R_1}{R_1 + R_2}\right) \qquad (2)$$

Similarly, in accordance with Kirchhoff's Current Law at node C, the current flowing from node A to node C is equal to the current flowing node C to node D, which provides:

$$\frac{V_a - V_c}{(R_1 + R_2)} = V_b T \qquad (3)$$

Equation (3) can be rewritten as:

$$V_c = V_a - V_b T(R_1 + R_2) \qquad (4)$$

Equation (2) can be plugged into equation (4) to yield the following:

$$V_c = V_a - T(R_1 + R_2)\left(V_c + \left((V_a - V_c)\frac{R_1}{R_1 + R_2}\right)\right) \qquad (5)$$

$$V_c = V_a - (TV_c R_1 + TV_c R_2 + TV_a R_1 - TV_c R_1) \qquad (6)$$

$$V_c = V_a - TV_c R_2 - TV_a R_1 \qquad (7)$$

$$V_c(1 + TR_2) = V_a(1 - TR_1) \qquad (8)$$

$$V_c = V_a \frac{(1 - TR_1)}{(1 + TR_2)} \qquad (9)$$

If $R_1 = 1/T$, then $V_c = 0$, which indicates that the voltage variations in the power supply voltage at node A are substantially suppressed at the output node C.

Such operation can be explained as follows. Any spurious voltage variations (Δv volts) at node B will cause a current I, which is equal to Δv*T amps, to flow through the transconductive element 18 due to its transconductance T. This current I causes a voltage drop across resistor $R_1$ of I*$R_1$ which serves to substantially remove the effects of the voltage variation Δv at the output node C. To illustrate this operation, consider the following example. Assume T has a value of 1 Amp/volt and $R_1 = 1/T = 1$ ohm. If the spurious voltage variations (Δv) at node B is 1 volt, then the current I (of Δv*T=1 amp) will flow through the transconductive element 18. This will cause a voltage drop of I*$R_1$=1 volt across the resistor $R_1$. Therefore, there is no change in the voltage level at the output node C, and the spurious voltage variation present at node B is substantially removed from the output.

For sensitive active loads, such as high fidelity audio components (e.g., audio preamplifiers, digital-to-analog converters, amplifiers, etc.), it is desirable that the output impedance of the circuit (as supplied to the active load) is small. The output impedance of the circuit is the impedance caused by the transconductance $(R_1+R_2)/(R_2*T)$ in parallel with the series impedance of resistors $R_1$ and $R_2$ $(R_1+R_2)$ and in parallel with the characteristic resistance G of the transconductive element 18. Initially, the resistance G can be neglected to obtain the following expressions of the output resistance $Z_{OUT}$ of the circuit:

$$Z_{OUT} = \left(\frac{R_2*T}{R_1+R_2} + \frac{1}{R_1+R_2}\right)^{-1} \quad (10)$$

$$Z_{OUT} = \left(\frac{1+(R_2*T)}{R_1+R_2}\right)^{-1} \quad (11)$$

$$Z_{OUT} = \left(\frac{R_1+R_2}{1+(R_2*T)}\right) \quad (12)$$

As described above, the value of resistance $R_1$ is selected such that it is substantially equal to $1/T$, which can be plugged into equation (12) to provide:

$$Z_{OUT} = \left(\frac{R_1+R_2}{1+\frac{R_2}{R_1}}\right) \quad (13)$$

Multiplying equation (13) by resistance $R_1$ provides:

$$Z_{OUT} = \left(\frac{R_1(R_1+R_2)}{R_1+R_2}\right) \quad (14)$$

$$Z_{OUT} = R_1 = \left(\frac{1}{T}\right) \quad (15)$$

Note that any current through the resistance G passes through a separate branch of the network and does not alter the equations, yet merely changes the output resistance $Z_{OUT}$ to:

$$Z_{OUT} = \left(T + \frac{1}{G}\right)^{-1} \quad (16)$$

This analysis shows that the impedance caused by the transconductance tends toward $(1/T)$ or $R_1$, and such impedance in parallel with $(R_1+R_2)$ tends toward $(1/T)$ or $R_1$. Thus, the output impedance of the circuit will approximate $(1/T)=R$ in parallel with G. If G is much larger than $R_1$, G may be neglected and the output impedance of the circuit will approximate $(1/T)=R_1$, which can be small and thus suitable for sensitive active loads.

In addition, this analysis shows that the effect of variations in the resistor $R_2$ (which may include any internal resistance or impedance of the DC power supply 12) on such output resistance is cancelled out.

In alternate embodiments, such as those embodiments that utilize a FET-type transistor or a vacuum tube device as the transconductive element 18, the DC operating characteristics of the transconductive element 18 may be set by a reference voltage level provided to the control terminal (e.g., terminal 2) of the transconductive element 18. This reference voltage level may be generated across one or more resistors in response to a reference current supplied thereto by a reference current source as is well known in the electronic arts.

Also note that the transconductance T of the transconductive element 18 will vary with the current passing through it. The addition of the resistance $R_2$ serves to minimize any effect such variation has upon the noise-canceling and ripple-canceling performance at the output node C of the circuit. In addition, the resistor $R_2$ may be replaced by an active current source which supplies a constant DC current but presents a high AC impedance as is well known in the electronic arts. This configuration can be modeled by setting the value of the resistor $R_2$ in the equations above to infinity. This modification will typically have little effect while the circuit is in balance, but can potentially improve the performance of the circuit when the value of resistance $R_1$ is not precisely equal to $(1/T)$.

Figure 2:
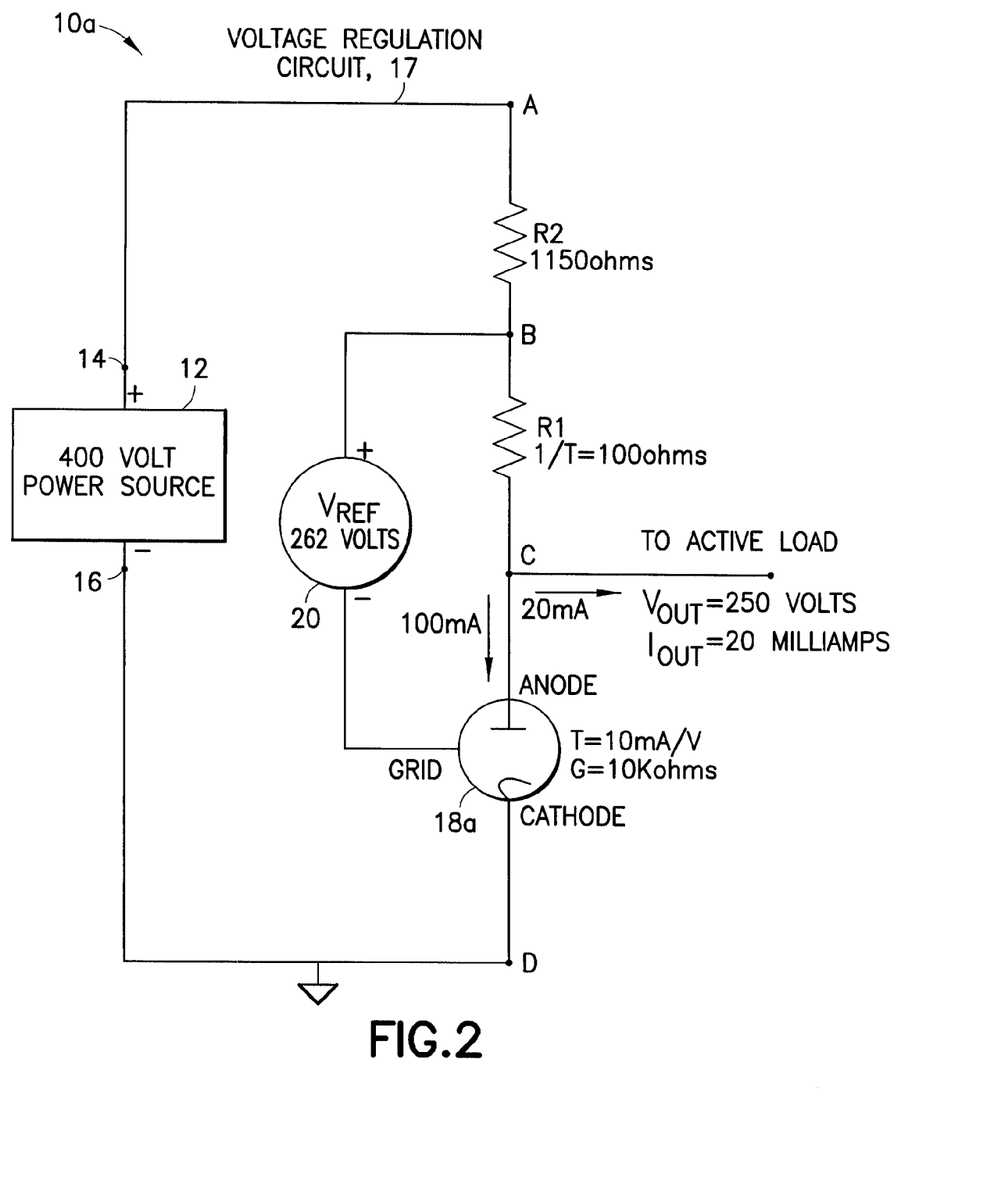
FIG. 2 is a schematic diagram of an exemplary embodiment of an improved power supply unit in accordance with the present invention, where a thermionic triode is used as the transconductive element that provides voltage regulation.

FIG. 2 illustrates an exemplary embodiment of a power supply unit 10a that uses a thermionic triode 18a as the transconductive element in accordance with the present invention. In this exemplary embodiment, the power source 12 is a 400 volt power source. The thermionic triode 18a has a characteristic transconductance T of 10 mA/V and a parallel resistance G of 10 kOhms. Resistor R2 is 1150 ohms and resistor R1 is 100 ohms. A voltage reference 20 of 262 volts is coupled between node B and the grid terminal of the triode 18a to produce the DC operating characteristics of 250 volts and 20 milliamps output from node C as shown. The resistance value of resistor R1 is substantially equal to $1/T$ such that spurious voltage variations at node A are suppressed at the output node C. The resistor $R_2$ is large and the impedance G is much larger than $R_1$ such that the output impedance of the circuit approximates $(1/T)=R_1=100$ ohms, which is suitable for sensitive equipment.

Figure 3:
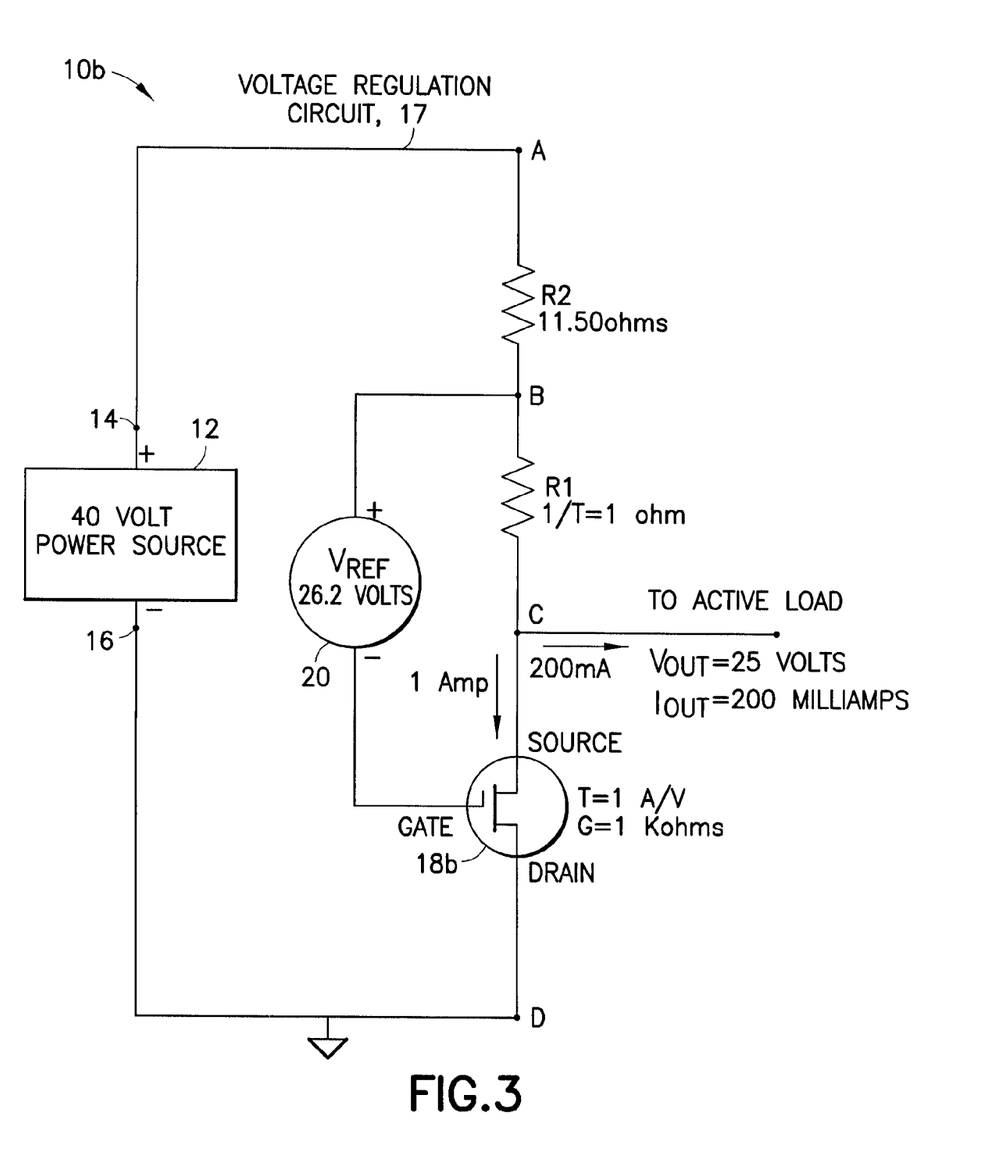
FIG. 3 is a schematic diagram of another exemplary embodiment of an improved power supply unit in accordance with the present invention, where a field effect transistor is used as the transconductive element that provides voltage regulation.

FIG. 3 illustrates an exemplary embodiment of a power supply unit 10b that uses a field effect transistor 18b as the transconductive element in accordance with the present invention. In this exemplary embodiment, the power source 12 is a 40 volt power source. The field effect transistor 18b has a characteristic transconductance T of 1 A/V and a parallel resistance G of 1 kOhms. Resistor R2 is 11.50 ohms and resistor R1 is 1 ohm. A voltage reference 20 of 26.2 volts is coupled between node B and the gate terminal of the field effect transistor to produce the DC operating characteristics of 25 volts and 200 milliamps output from node C as shown. The resistance value of resistor R1 is substantially equal to $1/T$ such that spurious voltage variations at node A are suppressed at the output node C. The resistor $R_2$ is large and the impedance G is much larger than $R_1$ such that the output impedance of the circuit approximates $(1/T)=R_1=1$ ohm, which is suitable for sensitive equipment.

In an alternate embodiment of the present invention, the resistance $R_1$ of the voltage regulation circuits of FIGS. 1 through 3 as described above may be replaced with an active device 19 that operates in response to small-signal voltage variations at node B to provide a small-signal voltage drop between nodes B and C that is substantially equal to the small-signal voltage drop between nodes B and D as provided by the transconductive element 18. The motivation for this design is evident from small-signal signal analysis of the circuits, which begins with the application of Kirchhoff's Voltage Law at node C to provide:

$$v_c = v_{bd} - v_{bc} \quad (17)$$

where $v_{bd}$ is the small-signal voltage drop between nodes B and D as provided by the transconductive element 18, and $v_{bc}$ is the small-signal voltage drop between nodes B and C as provided by the active device 19.

If $v_{bd}$ is substantially equal to $v_{bc}$, then $v_c$ is approximately zero, which indicates that the small-signal voltage variations in the power supply voltage at node B (which are derived from the supply voltage variations at node A) are substantially suppressed at the output node C, thus providing for improved noise and ripple cancellation at the output node C of the circuit.

Figure 4A:
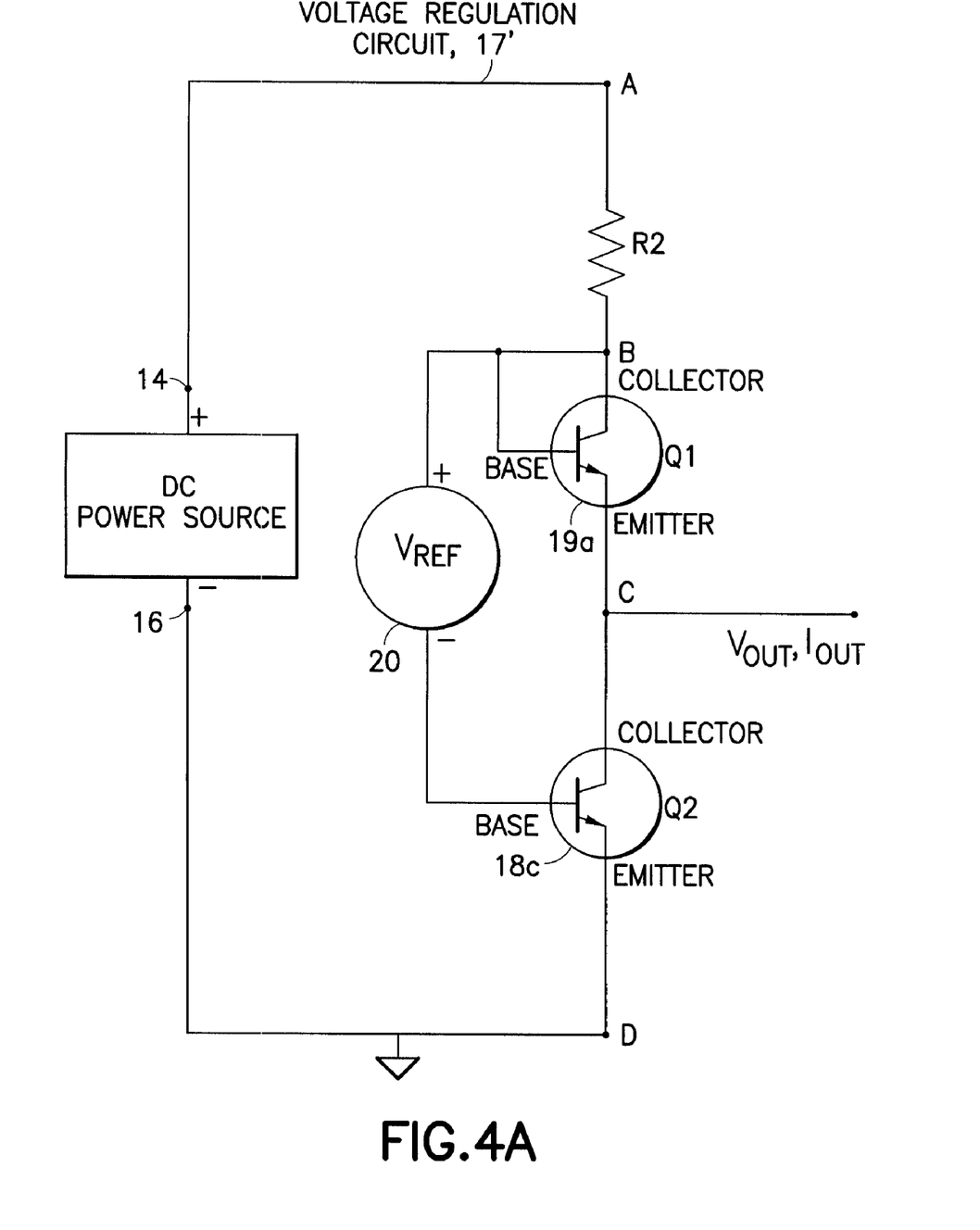
FIG. 4A is a schematic diagram of an exemplary embodiment of an improved power supply unit in accordance with the present invention, wherein matching bipolar transistors are used as an active device and transconductive element for voltage regulation.
Figure 4B:
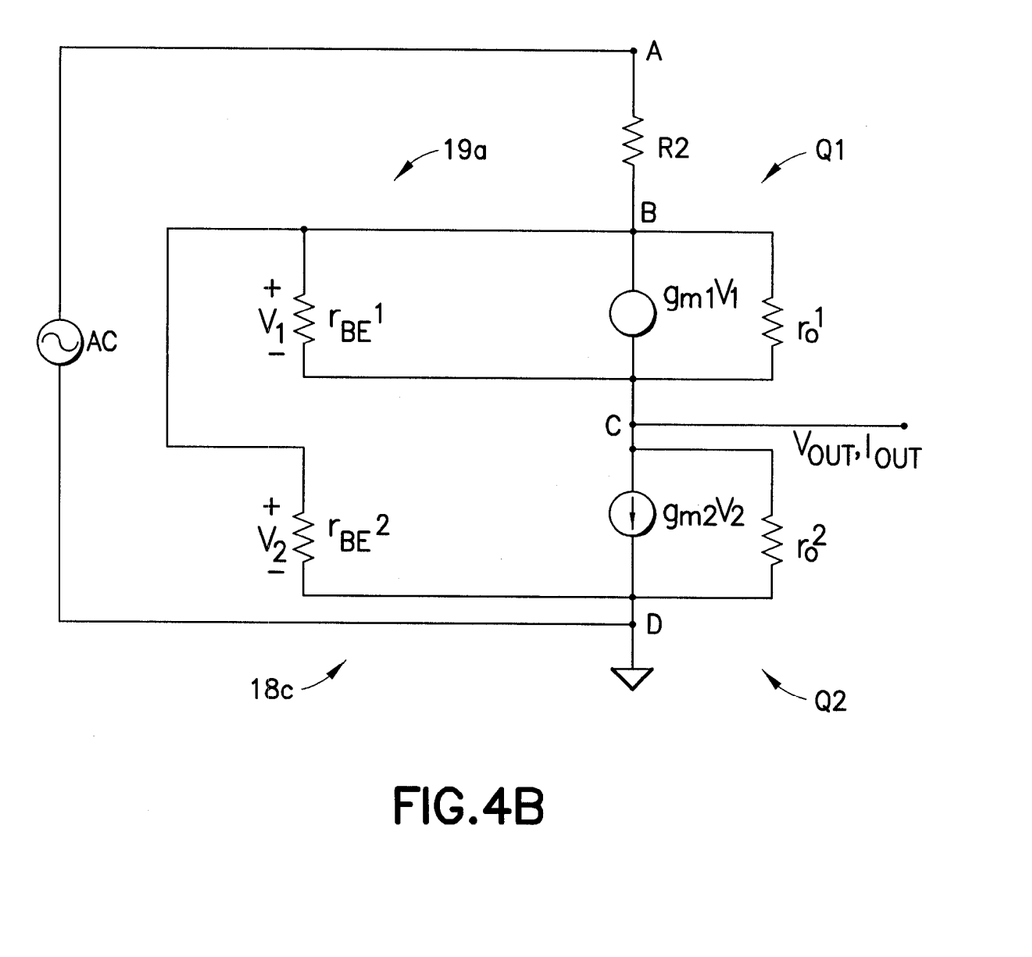
FIG. 4B is a model of the improved power supply unit of FIG. 4A that is used for AC signal analysis of the voltage regulation circuitry therein.

FIG. 4A illustrates an exemplary embodiment that utilizes bipolar transistors (18c and 19a) for the transconductive element 18 and the active device 19, respectively. Note that the bipolar transistor 19a is diode-connected such that the base and collector terminals of the device are tied to a common potential level at node B. In this configuration, it is important that the operating characteristics of the two bipolar transistors 18c, 19a substantially match one another in order to provide for substantially equal small-signal voltage drops (e.g., $v_{bd} = v_{bc}$) and thus effective cancellation of noise and ripple at the output node C of the circuit. This constraint is evident from the small-signal analysis of a simplified model of the circuit as shown in FIG. 4B. In this simplified model, a hybrid-π transistor model is used for the bipolar transistors 18c and 19a, respectively.

Note that resistors $r_o^1$ and $r_o^2$ of the bipolar transistors 18c and 19a are typically large and can be ignored (e.g., replaced by an open circuit). In addition, the currents flowing through $r_{BE}^1$ and $r_{BE}^2$ are typically much less than the current sources $g_{m1}v_1$ and $g_{m2}v_2$, respectively, and can be ignored. With these assumptions, one can apply Kirchhoff's Current Law at node C to provide:

$$g_{m1}v_1 = g_{m2}v_2 \quad (18)$$

In the event that the operating characteristics of the two bipolar transistors 18c and 19a are matched, then $g_{m1}$ is substantially equally to $g_{m2}$, and equation (18) can be simplified to provide:

$$v_1 = v_2 \quad (19)$$

One can then apply Kirchhoff's Voltage Law at node C to provide:

$$v_c = v_b - v_1 \quad (20)$$

$$v_c = v_2 - v_1 \quad (21)$$

Plugging in equation (19) into equation (21) yields:

$$v_c = v_1 - v_1 = 0 \quad (22)$$

This analysis indicates that the small-signal voltage variations in the power supply voltage at node B (which is derived from the voltage variations at node A) are substantially suppressed at the output node C, thus providing for effective noise and ripple cancellation at the output node C of the circuit.

Figure 5:
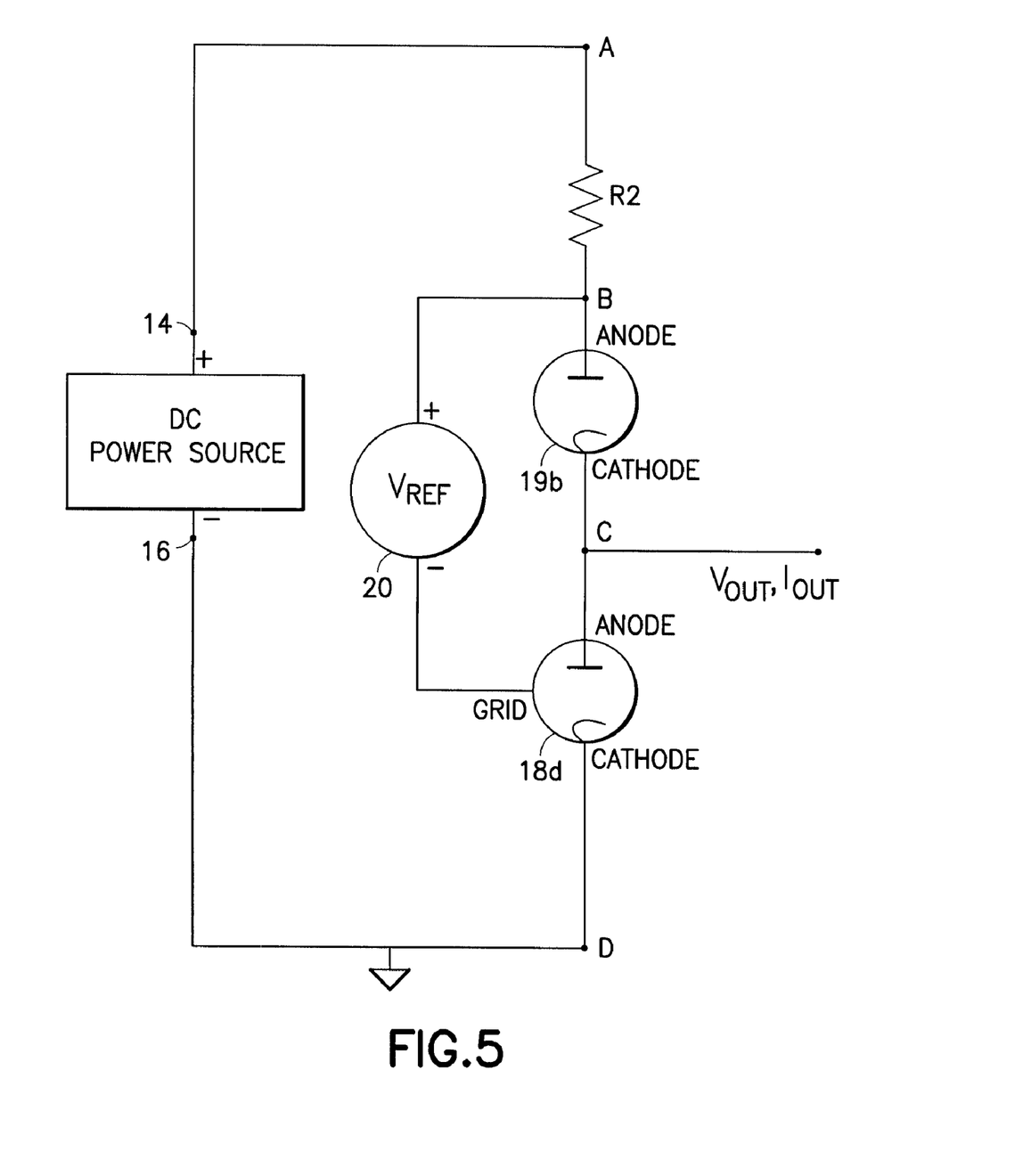
FIG. 5 is a schematic diagram of an exemplary embodiment of an improved power supply unit in accordance with the present invention, wherein matching vacuum tube devices are used as an active device and transconductive element for voltage regulation.

FIG. 5 illustrates an exemplary embodiment that utilizes vacuum tube devices (18d and 19b) for the transconductive element 18 and the active device 19, respectively. Note that the vacuum tube device 18d is a three terminal device (such as a triode valve) and the vacuum tube device 19b is a two terminal device (such as a diode valve). In this configuration, it is important that the operating characteristics of the two vacuum tube devices 18c, 19b substantially match one another in order to provide for substantially equal small-signal voltage drops (e.g., $v_{bd} = v_{bc}$) and thus effective cancellation of noise and ripple at the output node C of the circuit. This constraint may be satisfied by selecting a triode valve device 18d whose transconductance changes at the DC operating point with a slope that matches the slope of the change in the resistance of the diode valve device at the DC operating point. Alternatively, matching triode valve devices may be selected, and one of the matching triode valve devices is diode-connected to realize the active device 19b, which is similar to the exemplary embodiment described above with respect to FIGS. 4A and 4B.

Figure 6:
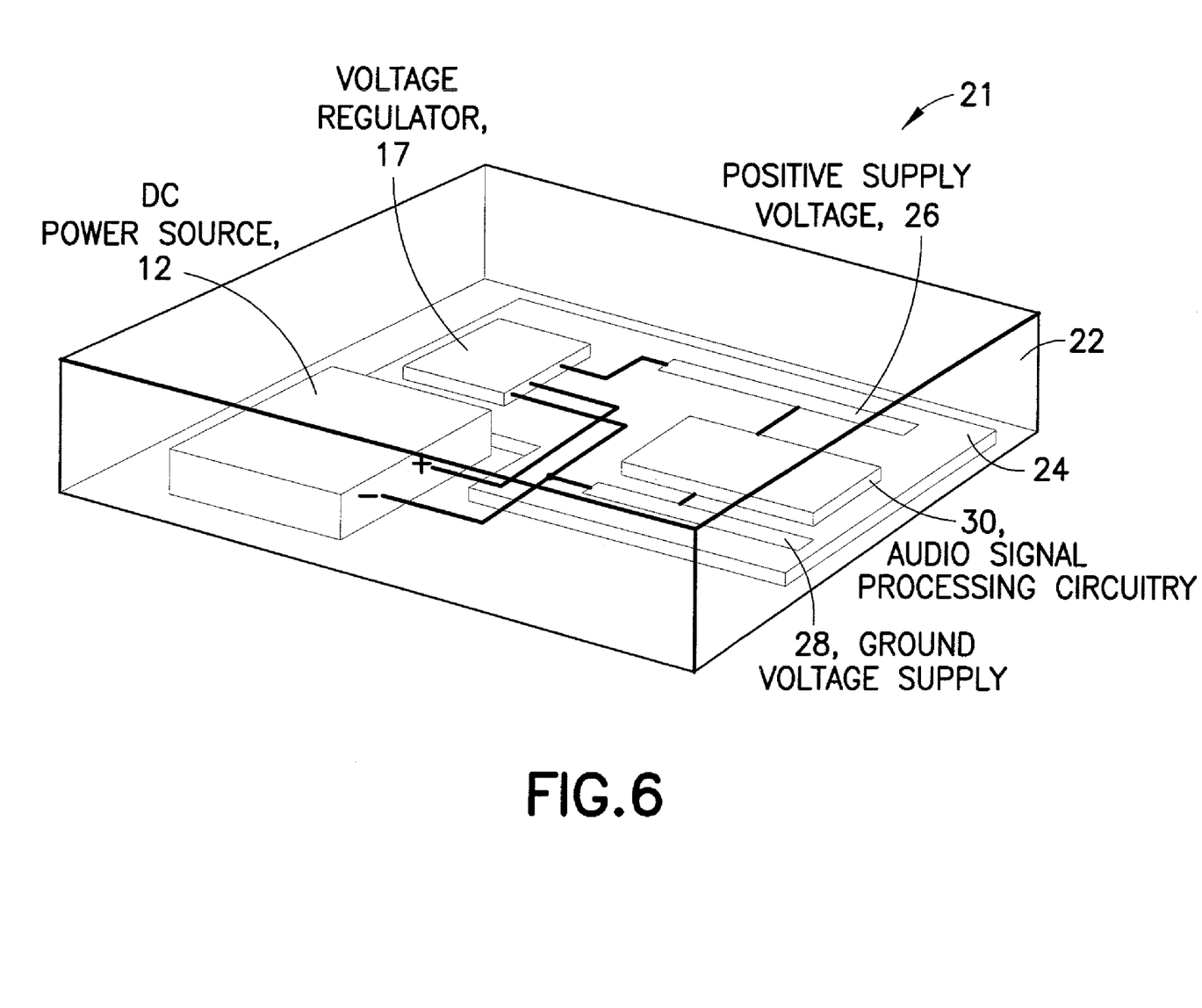
FIG. 6 is a pictorial illustration of an audio component (e.g., audio preamplifier, digital-to-analog converter, amplifier, etc) that utilizes an improved power supply unit to provide regulated voltage to audio signal processing circuitry therein in accordance with the present invention.

FIG. 6 illustrates an exemplary audio component 21 in accordance with the present invention. The audio component 21 includes a DC power source 12 enclosed within a system housing 22. The DC power source 12 may be an AC-to-DC power converter (which may be realized, for example, by a mains transformer and associated components) that converts an AC power signal from an AC power source (not shown) into the requisite DC voltage signal. Alternatively, the DC power source 12 may be battery or other suitable form of DC power supply. At least one circuit board 24 is enclosed within the housing 22. The circuit board 24 includes a voltage regulation circuit 17 as described above with respect to FIGS. 1 through 5. The voltage regulation circuit 17 conditions the voltage level supplied by the DC power source 12 (by suppressing unwanted noise at its output as described above) to provide a regulated voltage level to the positive supply voltage strip (or node) 26 realized on the circuit board 24. The DC power source 12 provides a reference voltage level (e.g., ground) to the ground voltage supply strip (or node) 28 realized on the circuit board 24. The positive voltage supply 26 and the negative voltage supply 28 provide regulated power to audio signal processing circuitry 30 realized on the circuit board 24. Such audio signal processing circuitry 30 may perform one or more of the following functions: digital-to-analog conversion of audio signals; pre-amplification of analog audio signals for output to a low noise amplifier; or amplification of analog audio signals for output to at least one audio speaker.

There have been described and illustrated herein several embodiments of an improved power supply unit that includes a simple and efficient voltage regulation circuit that compensates for spurious voltage level variations in the voltage levels supplied thereto. While particular embodiments of the invention have been described, it is not intended that the invention be limited thereto, as it is intended that the invention be as broad in scope as the art will allow and that the specification be read likewise. Thus, while particular voltage levels, current levels and other operating parameters have been disclosed, it will be appreciated that other parameters are suitable as well. In addition, while particular types of three-terminal transconductive elements have been disclosed, it will be understood other transconductive elements can be used. Moreover, while particular configurations have been disclosed, it will be appreciated that other configurations could be used as well. It will therefore be appreciated by those skilled in the art that yet other modifications could be made to the provided invention without deviating from its spirit and scope as claimed.

What is claimed is:

1. A power supply regulating circuit operably coupled between a DC power source and an active load, the DC power source including a positive terminal and a negative terminal, the power supply regulating circuit comprising:
   a plurality of elements coupled in series between said positive and negative terminals of said power source, said elements including at least one active device and a transconductive element that are operably coupled together at an output node that is connected to the active load, said transconductive element comprising a three terminal device, said at least one active device operably coupled between a first node and said output node, said transconductive element having an input terminal operably coupled to said first node,
   wherein said transconductive element operates in response to small signal voltage variations at said first node to provide a first small-signal voltage drop across said transconductive element, and
   wherein said at least one active device provides a second small-signal voltage drop between said first node and said output node that is substantially equal to said first small-signal voltage drop to thereby provide for stabilization of the voltage level at the output node for supply to the active load connected thereto.

2. A power supply regulating circuit according to claim 1, further comprising:
   a voltage reference operably coupled between said first node and said input terminal of said transconductive element, wherein said voltage reference sets DC operating conditions of said transconductive element to thereby set DC output voltage and DC output current supplied to said active load.

3. A power supply regulating circuit according to claim 1, wherein:
   said transconductive element and said at least one active device comprise vacuum tube devices with substantially similar operating characteristics.

4. A power supply regulating circuit according to claim 3, wherein:
   said transconductive element comprises a thermionic triode and said at least one active device comprises a vacuum tube diode device.

5. A power supply regulating circuit according to claim 1, wherein:
   said transconductive element and said at least one active device comprise transistor devices with substantially similar operating characteristics.

6. A power supply regulating circuit according to claim 5, wherein:
   said transconductive element and said at least one active device comprise matching bipolar transistors.

7. A power supply regulating circuit according to claim 1, wherein:
   said active load comprises audio signal processing circuitry.

8. A power supply regulating circuit according to claim 7, wherein:
   said audio signal processing circuit performs at least one of
   (i) digital-to-analog conversion of audio signals,
   (ii) pre-amplification of analog audio signals for output to a low noise amplifier, and
   (iii) amplification of analog audio signals for output to at least one audio speaker.

9. A power supply regulating circuit according to claim 1, wherein:
   said DC power source comprises an AC-to-DC power adapter.

10. A power supply regulating circuit according to claim 1, wherein:
    said DC power source comprises a battery.

11. A power supply unit for supplying electrical power to an active load, the power supply unit comprising:
    a DC power source including a positive terminal and a negative terminal; and
    a plurality of elements coupled in series between said positive and negative terminals of said power source, said elements including at least one active device and a transconductive element that are operably coupled together at an output node that is connected to the active load, said transconductive element comprising a three terminal device, said at least one active device operably coupled between a first node and said output node, said transconductive element having an input terminal operably coupled to said first node,
    wherein said transconductive element operates in response to small signal voltage variations at said first node to provide a first small-signal voltage drop across said transconductive element, and
    wherein said at least one active device provides a second small-signal voltage drop between said first node and said output node that is substantially equal to said first small-signal voltage drop to thereby provide for stabilization of the voltage level at the output node for supply to the active load connected thereto.

12. A power supply unit according to claim 11, further comprising:
    a voltage reference operably coupled between said first node and said input terminal of said transconductive element, wherein said voltage reference sets DC operating conditions of said transconductive element to thereby set DC output voltage and DC output current supplied to said active load.

13. A power supply unit according to claim 11, wherein:
    said transconductive element and said at least one active device comprise vacuum tube devices with substantially similar operating characteristics.

14. A power supply unit according to claim 13, wherein:
    said transconductive element comprises a thermionic triode and said at least one active device comprises a vacuum tube diode device.

15. A power supply unit according to claim 11, wherein:
    said transconductive element and said at least one active device comprise transistor devices with substantially similar operating characteristics.

16. A power supply unit according to claim 15, wherein:
    said transconductive element and said at least one active device comprise matching bipolar transistors.

17. A power supply unit according to claim 11, wherein:
    said active load comprises audio signal processing circuitry.

18. A power supply unit according to claim 17, wherein:
    said audio signal processing circuitry performs at least one
    (i) digital-to-analog conversion of audio signals,
    (ii) pre-amplification of analog audio signals for output to a low noise amplifier, and
    (iii) amplification of analog audio signals for output to at least one audio speaker.

19. A power supply unit according to claim 11, wherein:
    said DC power source comprises an AC-to-DC power adapter.

20. A power supply unit according to claim 11, wherein:
    said DC power source comprises a battery.

* * * * *